United States Patent [19]
Kitou et al.

[11] Patent Number: 5,363,022
[45] Date of Patent: Nov. 8, 1994

[54] HORIZONTAL DEFLECTION CIRCUIT WITH REDUCED VLF ELECTRIC FIELDS FROM CRT DISPLAYS

[75] Inventors: Kouji Kitou; Nobutaka Okuyama; Ikuya Arai, all of Yokohama; Yuji Sano, Zushi, all of Japan

[73] Assignee: Hitachi Ltd., Tokyo, Japan

[21] Appl. No.: 26,815

[22] Filed: Mar. 5, 1993

[30] Foreign Application Priority Data

May 8, 1992 [JP] Japan .................. 4-115896

[51] Int. Cl.$^5$ .......... G09G 1/04; H01J 29/70; H01J 29/06; H01J 1/52
[52] U.S. Cl. .................. 315/408; 315/8; 315/85
[58] Field of Search .......... 315/408, 411, 8, 85, 315/371, 391, 405; 307/91

[56] References Cited

U.S. PATENT DOCUMENTS

| | | | |
|---|---|---|---|
| 3,764,846 | 10/1973 | Gantt et al. | 315/405 |
| 4,540,933 | 9/1985 | Teuling | 315/411 |
| 5,151,635 | 9/1992 | Cappels | 315/370 |
| 5,162,706 | 11/1992 | Hsu | 315/411 |
| 5,218,270 | 6/1993 | Haapakoski | 315/85 |

*Primary Examiner*—Gregory C. Issing
*Attorney, Agent, or Firm*—Antonelli, Terry, Stout & Kraus

[57] ABSTRACT

A horizontal deflection circuit for a CRT supplies an exciting current in such a way that flyback voltages including both a positive voltage and a negative voltage as components are generated in horizontal deflection coils of a horizontal deflection yoke, respectively, during energizing the horizontal deflection yoke to provide a magnetic field for horizontal scans. A positive electric field of VLF and a negative electric field of VLF which are generated in the horizontal deflection yoke by the respective flyback voltages cancel each other to decrease a composite electric field of VLF emitted from the horizontal deflection yoke. This prevents unwanted radiation leaking to the outside of the a CRT display.

7 Claims, 13 Drawing Sheets

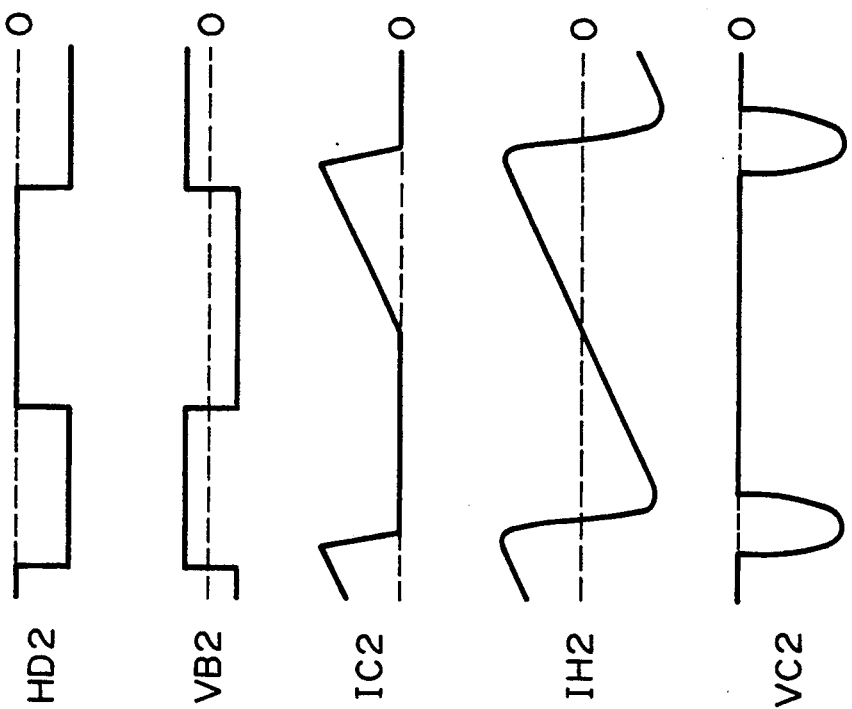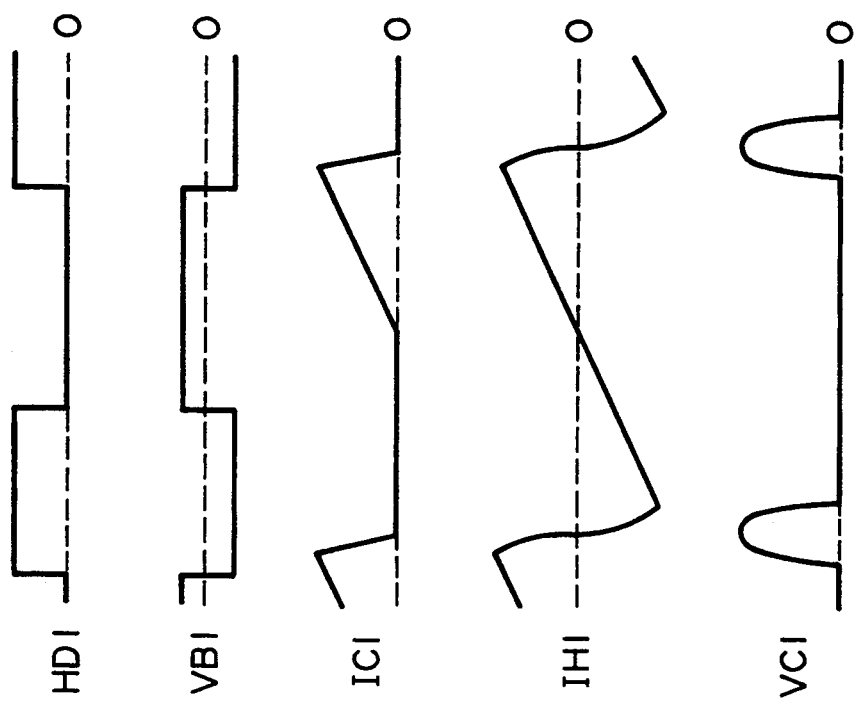

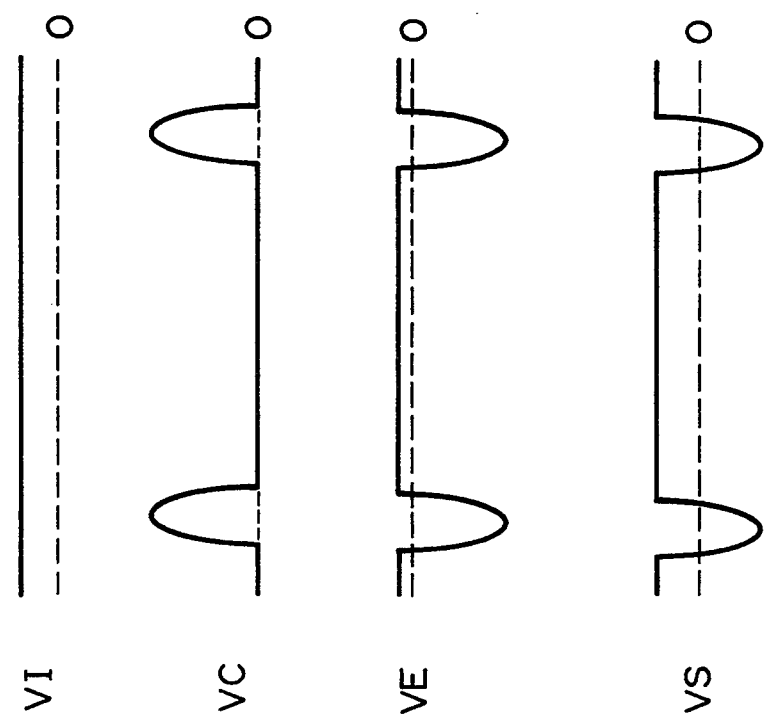
FIG. IIA
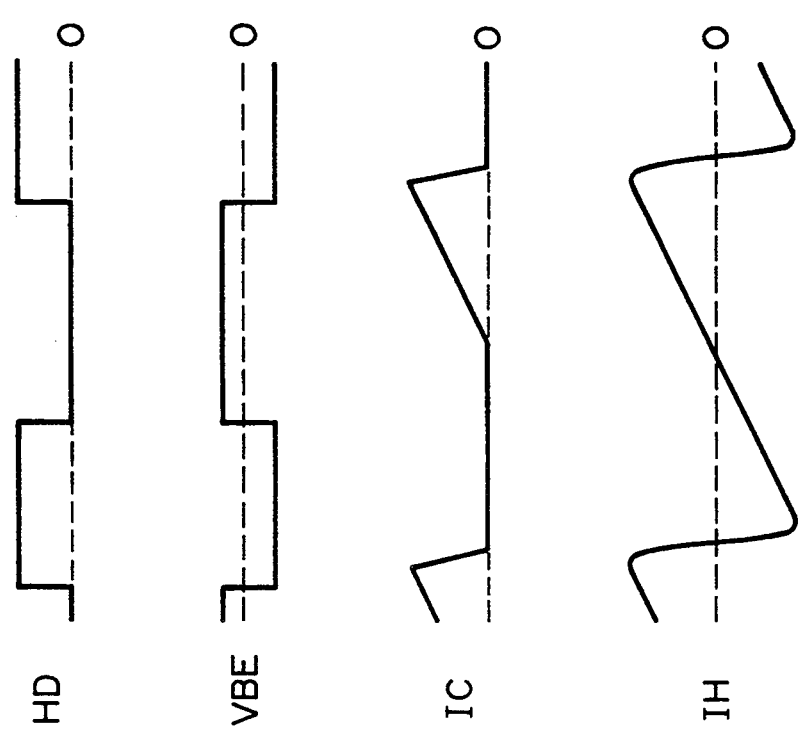
FIG. IIB

HORIZONTAL DEFLECTION CIRCUIT WITH REDUCED VLF ELECTRIC FIELDS FROM CRT DISPLAYS

BACKGROUND OF THE INVENTION

1. Field of the Invention

The present invention relates to a horizontal deflection circuit designed to reduce the amount of unwanted radiation of electric fields generated from a CRT (cathode ray tube) and, in particular, from CRTs used for a computer display.

2. Description of the Related Art

In recent years, in displays for computers, decreasing unwanted radiation of an electric field or a magnetic field radiated from the display has become an important subject because there is the possibility that the unwanted radiation thereof is injurious to the health of a user. This object has heretofore been attained by performing electrostatic shielding or electromagnetic shielding using a metallic member for the chassis of the display, as disclosed by Onoe et al in JPA 61-42684, for example. Moreover, in order to reduce the unwanted radiation of the electric field, such technology has also been developed that a transparent conductive layer is provided on a front surface of the Braun tube (CRT) to perform the electrostatic shielding.

On the other hand, as for the method of reducing the unwanted radiation itself from the display, by paying attention to the fact that the unwanted radiation from a horizontal deflection circuit is mainly due to flyback pulses having very high voltage of a single polarity induced in the horizontal deflection circuit, a system of the horizontal deflection circuit which does not generate flyback pulses has been proposed. For example, Wakazono proposed a new scanning system in JP-A-53-133333 which is designed in such a way that the retrace of each sweep cycle is performed in the same period of time as that of the sweep in the forward direction, the beam for carrying the video information arranged in the forward direction is deflected during the sweep in the forward direction, and the beam for carrying the video signals arranged in the reverse direction is deflected during the retrace period. According to this new system, the occurrence of the flyback voltage due to the rapid retrace can be prevented to decrease the unwanted radiation of the electric field. And Kawafuchi et al disclose a deflection circuit using sinusoidal waves to eliminate flyback pulses in JPA3-72783.

However, in the prior art shielding methods, there arise serious problems that both the weight and cost increase because of the use of the metallic member, and it takes too much time for production since trial and error is required for the optimal design. In addition, in the system by Wakazono, there arises a problem that a large-scale circuit which is different in structure from the prior art CRT is required.

SUMMARY OF THE INVENTION

It is therefore an object of the present invention to provide a horizontal deflection circuit which is capable of decreasing the unwanted radiation of an electric field of VLF (very low frequency) radiated from a horizontal deflection circuit with a simple structure, and which is suitable for a CRT, in particular for a computer display, by solving the above-mentioned prior art problems.

It is another object of the present invention to provide a CRT display which generates less unwanted radiation which leaks to the outside.

It is still another object of the present invention to provide a deflection yoke which is suitable for realizing a CRT display which generates less unwanted radiation which leaks to the outside.

In order to solve the above-mentioned problems, a horizontal deflection circuit for a CRT according to the present invention is designed in such a way that a flyback voltage including both a positive voltage and a negative voltage is generated in a horizontal deflection coil of a horizontal deflection yoke. Therefore, since a positive electric field of VLF and a negative electric field of VLF derived from the respective voltages cancel each other, the magnitude of a composite electric field of VLF, which is radiated from the horizontal deflection yoke, becomes very small, so that the unwanted radiation does not leak to the outside of the CRT.

A first preferred embodiment of the present invention is designed in such a way that the horizontal deflection coil is divided into two parts, the power is supplied in such a manner that the flyback voltage generated in one coil has a reverse phase to the phase of the flyback voltage generated in the other coil, and as a result, the unwanted radiation which leaks to the outside of the CRT is decreased.

A second preferred embodiment of the present invention is designed in such a way that flyback pulses having both positive and negative voltage components across a neutral point are developed between both ends of the horizontal deflection coil of the horizontal deflection yoke so that the electric fields of VLF radiated from the horizontal deflection yoke cancel each other.

Moreover, a CRT display of the present invention includes the above-mentioned horizontal deflection circuit thereby to drive the horizontal deflection yoke. The CRT display of the present invention can suppress the radiation of the electric fields of VLF.

Further, the horizontal deflection yoke of the present invention includes two horizontal deflection coils independent of each other so that separate power sources can be connected to terminals of the respective coils thereby to be able to display functions of the above-mentioned horizontal deflection circuit for suppressing the radiation of the electric fields of VLF.

BRIEF DESCRIPTION OF THE DRAWINGS

FIG. 2A shows signal waveforms of respective parts of a first horizontal drive circuit and a first horizontal output circuit of the horizontal deflection circuit shown in FIG. 1;

FIG. 2B shows signal waveforms of a second horizontal drive circuit and a second horizontal output circuit of the circuit shown in FIG. 1;

FIG. 11A shows operating waveforms of a first part of the circuit shown in FIG. 10;

FIG. 11B shows operating waveforms of a second part of the circuit shown in FIG. 10;

DESCRIPTION OF THE PREFERRED EMBODIMENTS

Figure 1:
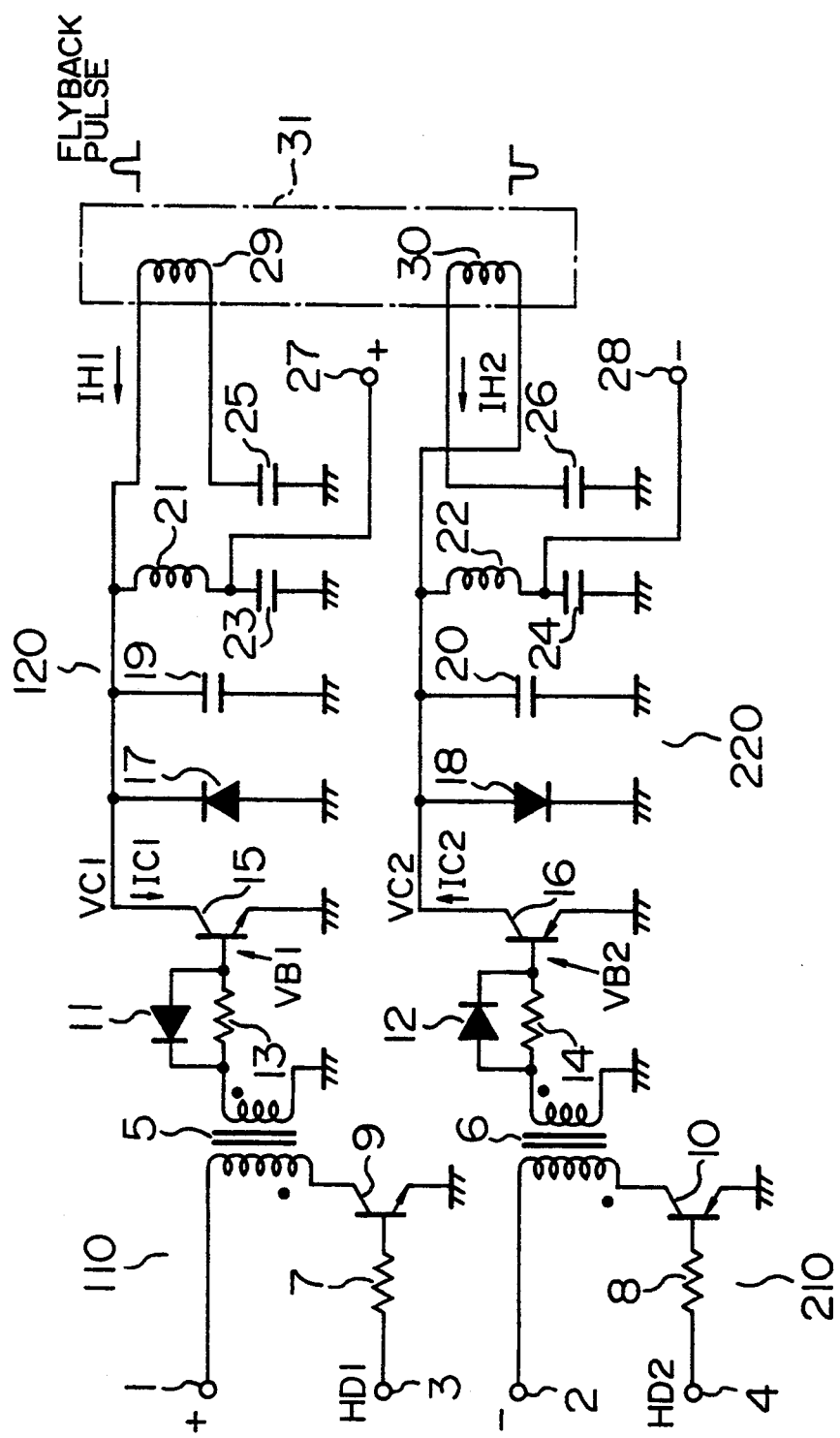
FIG. 1 is a circuit diagram showing a structure of a first aspect of a first embodiment of a horizontal deflection circuit according to the present invention.

The preferred embodiments of the present invention will hereinafter be described in detail with reference to the accompanying drawings. Incidentally, in the figures, parts which have the same function are designated by the same reference numerals.

FIGS. 1 to 15 are diagrams showing embodiments of a horizontal deflection circuit according to the present invention. Incidentally, in general, the horizontal deflection circuit consists of a horizontal oscillation circuit, a horizontal drive circuit, and a horizontal output circuit. However, in the horizontal deflection circuit according to the present invention, since the horizontal oscillation circuit has no inventive steps in structure, only the horizontal drive circuit part and the horizontal output circuit part will be shown, and the illustration of the horizontal oscillation circuit will be omitted here for the sake of simplicity.

FIG. 1 is a circuit diagram showing a structure of a first aspect of a first embodiment of the horizontal deflection circuit according to the present invention.

In the horizontal deflection circuit of the present aspect, a horizontal deflection coil of a horizontal deflection yoke 31 is divided into two parts 29 and 30. In this connection, the first coil 29 is furnished with a first horizontal drive circuit and a first horizontal output circuit which serve to generate a positive flyback voltage VC1, and the other or second coil 30 is furnished with a second horizontal drive circuit and a second horizontal output circuit which serve to generate a negative flyback voltage VC2 which has a reverse phase with respect to the positive flyback voltage VC1.

More specifically, in FIG. 1, the reference numeral 110 shown inclusively designates the first horizontal drive circuit. In this first horizontal drive circuit 110, the reference numeral 1 designates a power source terminal to be connected to a positive power source for drive, the reference numeral 3 designates a signal input terminal for receiving a horizontal drive signal HD1, the reference numeral 5 designates a first horizontal drive transformer, the reference numeral 7 designates a resistor, the reference numeral 9 designates an NPN type first horizontal drive transistor, the reference numeral 11 designates a diode, and the reference numeral 13 designates a resistor. The power source terminal 1 is connected to one end of the primary coil of the first horizontal drive transformer 5, through which the power of positive voltage provided from the power source terminal 1 is supplied to a collector of the horizontal drive transistor 9. An emitter of the horizontal drive transistor 9 is grounded, and the horizontal drive signal HD1 from the horizontal oscillation circuit not shown is supplied through the resistor 7 to a base of the transistor 9. One end of the secondary coil of the horizontal drive transformer 5 is grounded, and the other end thereof supplies a signal VB1 to the first horizontal output circuit through the parallel circuit of the diode 11 and the resistor 13.

Moreover, the reference numeral 120 shown inclusively designates the first horizontal output circuit. In this first horizontal output circuit 120, the reference numeral 15 designates an NPN type first horizontal output transistor, the reference numeral 17 designates a damper diode, the reference numeral 19 designates a resonance capacitor, the reference numeral 21 designates a choke coil, the reference numerals 23 and 25 designate capacitors, and the reference numeral 27 designates a power source terminal connected to the positive power source. The output signal VB1 of the first horizontal drive circuit is input to a base of the first horizontal output transistor 15. An emitter of the first horizontal output transistor 15 is grounded, and a collector thereof is connected to a cathode of the damper diode 17. An anode of the damper diode 17 is grounded. One end of the resonant capacitor 19 is grounded, and the other end thereof is connected to a cathode of the damper diode 17. One end of the choke coil 21 is connected to the collector of the transistor 15, and to the other end thereof is connected a power source terminal 27. Moreover, the other end of the choke coil 21 is also connected to one end of the capacitor 23 the other end of which is grounded.

One end of the first horizontal deflection coil 29 of the horizontal deflection yoke 31 is connected to one end of the resonant capacitor 19 which is not grounded, and the other end thereof is connected to one end of the capacitor 25 the other end of which is grounded.

The reference numeral 210 shown inclusively designates the second horizontal drive circuit. In this second horizontal drive circuit 210, the reference numeral 2 designates a power source terminal connected to a negative power source for drive, the reference numeral 4 designates a signal input terminal for receiving a second horizontal drive signal, the reference numeral 6 designates a second horizontal drive transformer, the reference numeral 8 designates a resistor, the reference numeral 10 designates a PNP type second horizontal drive transistor which acts complimentarily to the first horizontal drive transistor, the reference numeral 12 designates a diode which is connected in a direction opposite to that of the diode 11, and the reference numeral 14 designates a resistor. Moreover, the reference numeral 220 shown inclusively designates the second horizontal output circuit. In this second horizontal output circuit 220, the reference numeral 16 designates a PNP type second horizontal output transistor, the reference numeral 18 designates a damper diode which is connected so as to be opposite in polarity to the damper diode 17, the reference numeral 20 designates a resonant capacitor, the reference numeral 22 designates a choke coil, the reference numerals 24 and 26 designate capacitors, and the reference numeral 28 designates a power source terminal to which a negative power source is connected. The second horizontal drive circuit and the second horizontal output circuit are constructed so as to be substantially opposite in polarity to the first horizontal drive circuit and the first horizontal output circuit, respectively, and are connected to the second horizontal deflection coil 30.

FIGS. 2A and 2B are waveform charts showing signal waveforms during the operation of the respective parts in the horizontal deflection circuit shown in FIG. 1.

FIG. 2A shows signal waveforms of the first horizontal drive circuit 110 and the first horizontal output circuit 120. In the figure, when the first horizontal drive signal designated by the reference symbol HD1 is input to the input terminal 3, the first horizontal drive transistor 9 is turned on or off, a pulse voltage is induced across the secondary coil of the horizontal drive transformer 5, and the signal voltage which is designated by the reference symbol VB1 and which has a reverse phase with respect to the horizontal drive signal HD1 is applied to the base of the first horizontal output transistor 15. As a result, a collector current designated by the reference symbol IC1 is caused to flow through the first horizontal output transistor 15, a horizontal deflection current which is designated by the reference symbol IH1 and has a sawtooth waveform is caused to flow through the first horizontal deflection coil 29, a linear scanning field is generated in the yoke 31, and the electron beam is deflected to perform the sweep. Due to the induced voltage induced across the first horizontal deflection coil 29 in the retrace period of the scanning cycle, a positive flyback pulse designated by the reference symbol VC1 is generated at the collector of the first horizontal output transistor 15.

FIG. 2B shows signal waveforms of the second horizontal drive circuit 210 and the second horizontal output circuit 220. When the second horizontal drive signal HD2 is applied to the input terminal 4, the second horizontal drive transistor 10 is turned on or off, the pulse voltage is induced across the secondary coil of the horizontal drive transformer 6, and the signal voltage VB2 is applied to the base of the second horizontal output transistor 16. As a result, a collector current IC2 is caused to flow through the second horizontal output transistor 16, a horizontal deflection current IH2 is caused to flow through the second horizontal deflection coil 30, and in the same retrace period as that of the above case, a reverse or negative flyback pulse VC2 is generated at the collector of the second horizontal output transistor 16.

As a result, both the positive flyback pulse and the negative flyback pulse are simultaneously applied to the horizontal deflection yoke around which the horizontal deflection coil is wound, so that the radiation of an electric field generated by the positive flyback pulse and the radiation of an electric field generated by the negative flyback pulse cancel each other. Therefore, it is possible to reduce the radiation of the unwanted electric fields from the horizontal deflection circuit, and, as a result, it is possible to realize a horizontal deflection circuit with decreased electric field radiation for a computer display.

Figure 3:
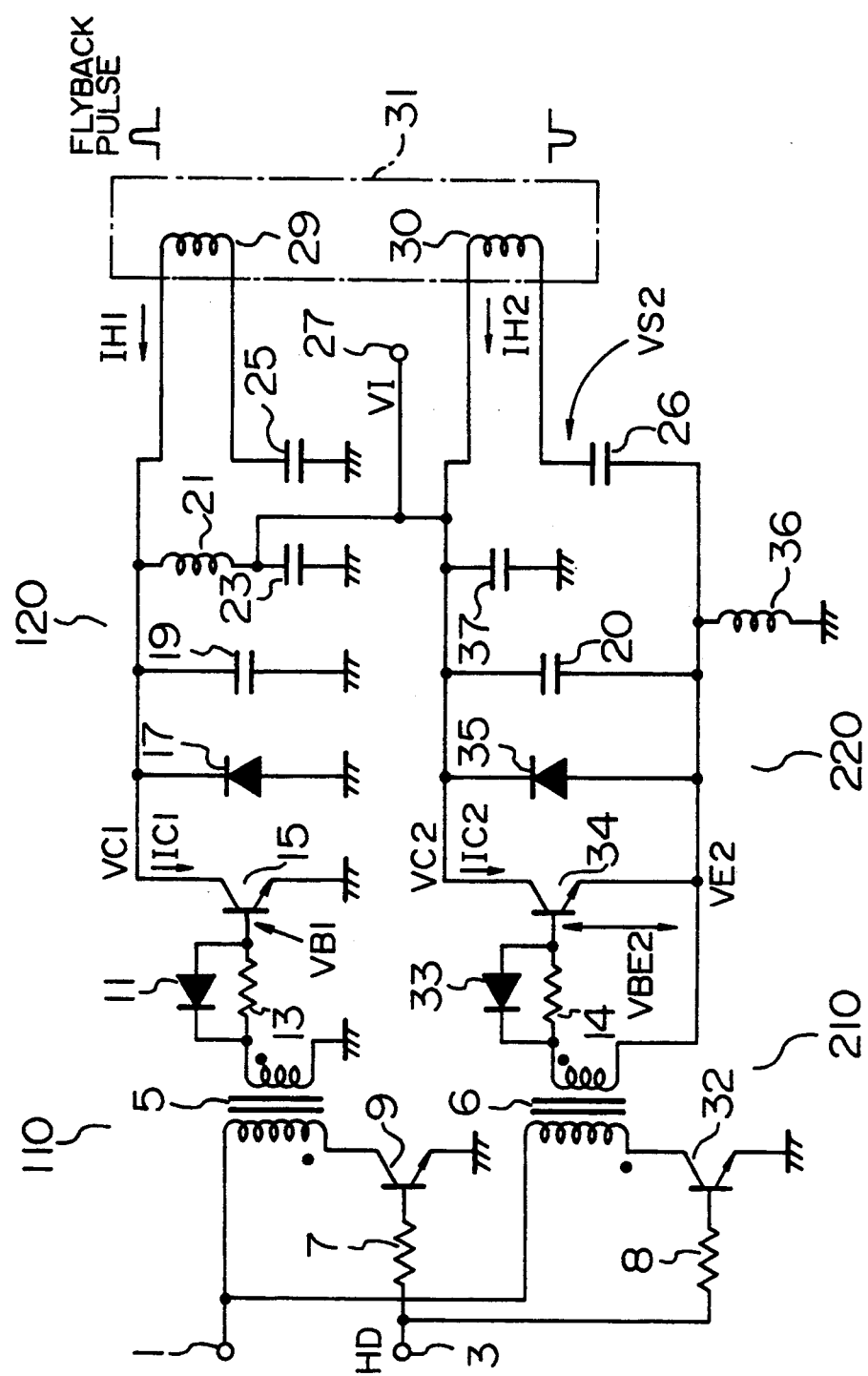
FIG. 3 is a circuit diagram showing a structure of a second aspect of the first embodiment of the horizontal deflection circuit according to the present invention.

FIG. 3 is a circuit diagram showing a structure of a second aspect of the first embodiment of the horizontal deflection circuit according to the present invention. In FIG. 3, the reference numeral 32 designates a second horizontal drive transistor which has the same type as that of the first transistor 9, the reference numeral 33 designates a diode which is connected in the same direction as that of connection of the diode 11, the reference numeral 34 designates a second horizontal output transistor which has the same type as that of the first transistor 15, the reference numeral 35 designates a damper diode which is connected in the same direction as that of the connection of the diode 17, the reference numeral 36 designates a choke coil, and the reference numeral 37 designates a capacitor.

Points of difference of the present aspect from the first aspect of the first embodiment of FIG. 1 are that the power for driving the second horizontal drive circuit 210 is supplied from the positive power source input terminal 1, that a second horizontal drive signal is the same as the first horizontal drive signal HD, that the second horizontal drive transistor 32 and the second horizontal output transistor 34 are changed from PNP type to NPN type, and that a collector of the second horizontal output transistor 34 is connected to the power source terminal 27 to supply the positive power source VI and an emitter thereof is grounded through the choke coil 36.

Figure 4A:
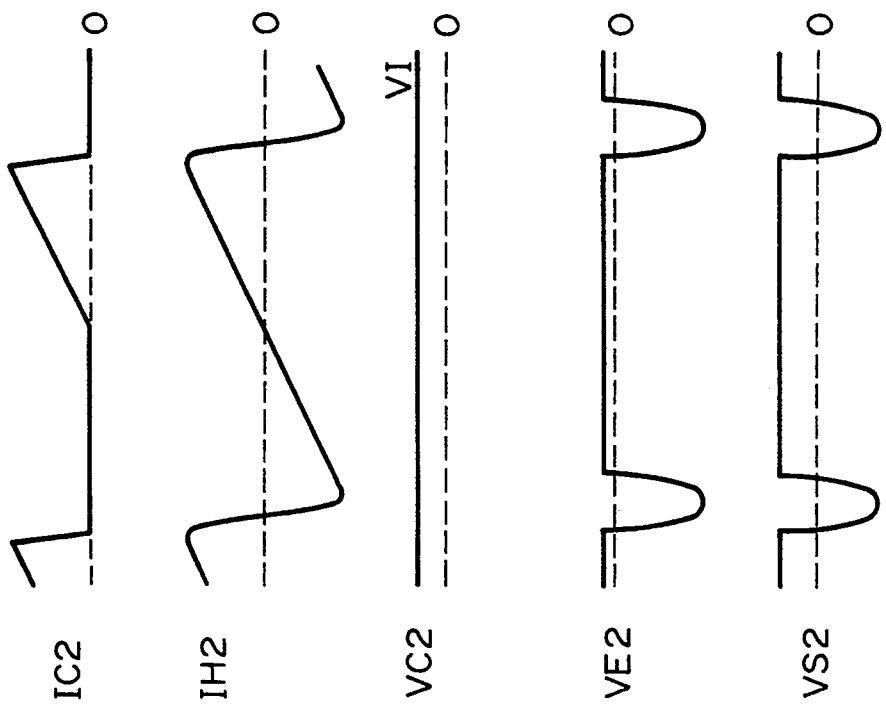
FIG. 4A shows signal waveforms of a first horizontal drive circuit and a first horizontal output circuit of the horizontal deflection circuit shown in FIG. 3.

FIG. 4A shows the operation of the first horizontal drive circuit 110 and the first horizontal output circuit 120 of the horizontal deflection circuit and shows the same signal waveform charts as those of FIG. 2A of the first aspect.

Figure 4B:
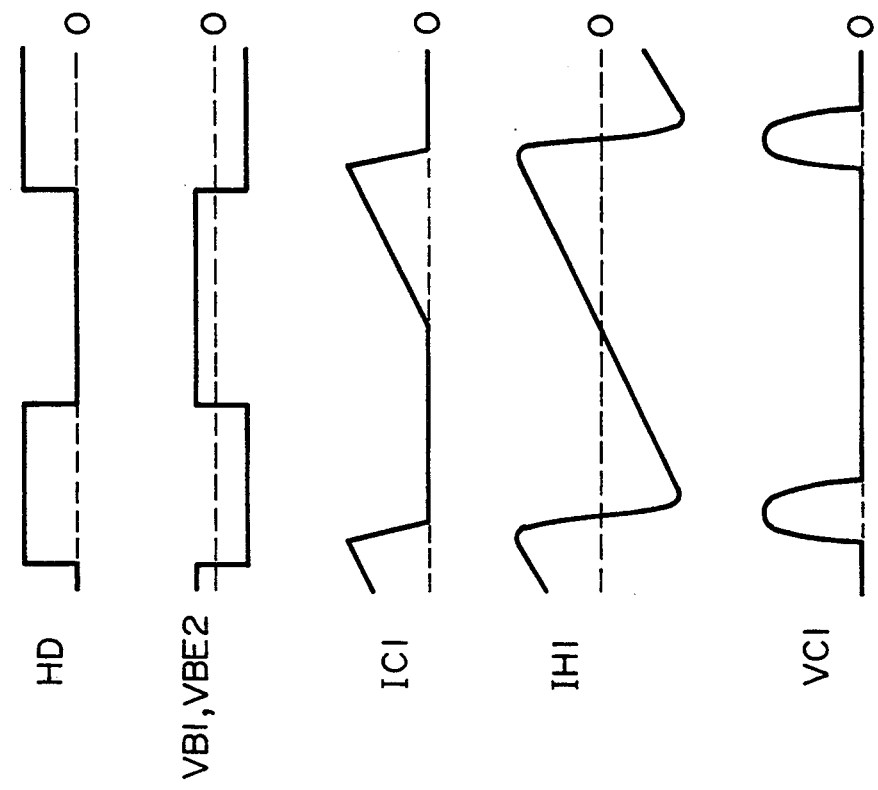
FIG. 4B shows signal waveforms of a second horizontal output circuit of the circuit shown in FIG. 3.

FIG. 4B shows waveform charts of the operation of the second horizontal drive circuit 210 and the second horizontal output circuit 220 of the horizontal deflection circuit shown in FIG. 3. In the circuit shown in FIG. 3, when the horizontal drive signal HD is applied to the input terminal 3, the first horizontal drive transistor 9 and the second horizontal drive transistor 32 are simultaneously turned on or off, a pulse voltage is induced across the secondary coil of the second horizontal drive transformer 6 and a voltage VBE2 which has a reverse phase with respect to the horizontal drive signal HD and which is the same as the voltage VB1 is applied across the emitter and base of the second horizontal output transistor 34.

As a result, a collector current IC2 is caused to flow through the second horizontal output transistor 34, and a horizontal deflection current IH2 is caused to flow through the second horizontal deflection coil 30 in the same direction as that of the horizontal deflection current IH1 flowing through the horizontal deflection coil 29. At the same time, a reverse or negative flyback pulse voltage VE2 which is opposite in polarity to VC1 is developed at the emitter of the second horizontal output transistor.

At this time, a collector voltage VC2 of the second horizontal output transistor 34 is equal to the voltage VI applied to the positive power source input terminal 27. Moreover, the voltage at the connection between the second horizontal deflection coil 30 and the capacitor 26 becomes a negative flyback pulse voltage VS2, the average of which is equal to VC2.

As a result, since the positive flyback pulse voltage VC1 and the negative flyback pulse voltage VS2 are simultaneously applied to the horizontal deflection yoke 31, the radiation of an electric field generated by the positive flyback pulse voltage and the radiation of an electric field generated by the negative flyback pulse voltage cancel each other. Therefore, it is possible to realize a horizontal deflection circuit with decreased unwanted radiation.

Figure 5:
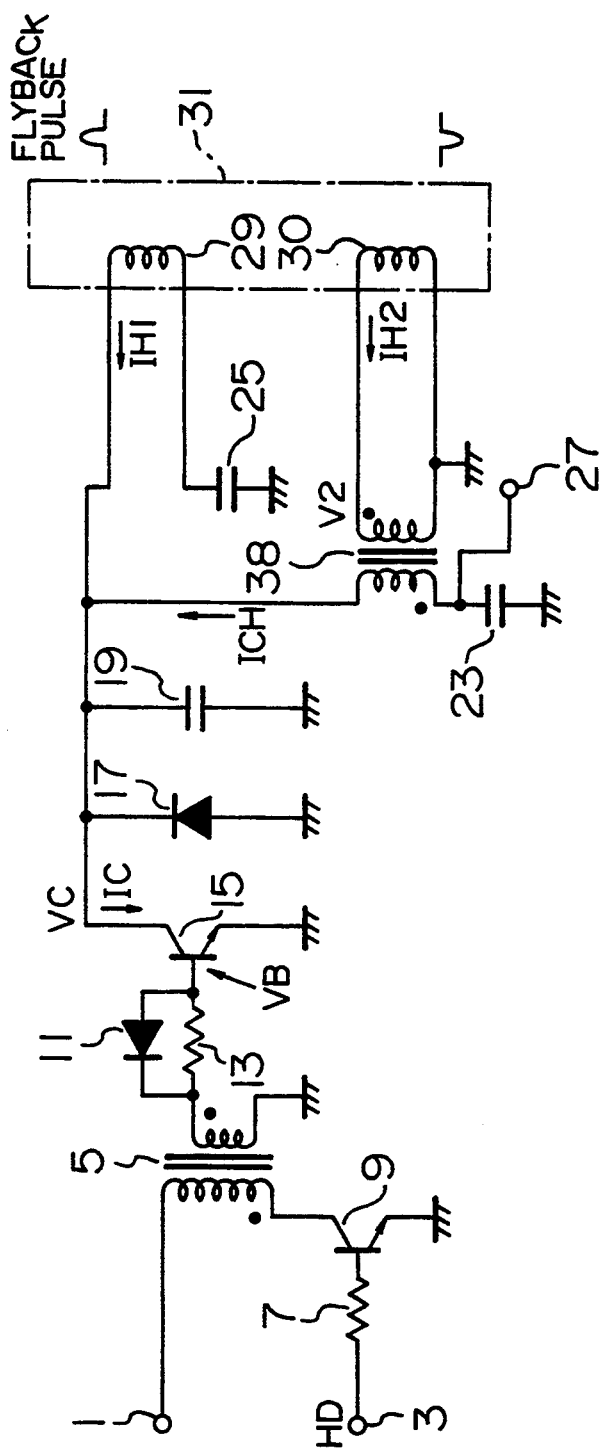
FIG. 5 is a circuit diagram showing a structure of a third aspect of the first embodiment of the horizontal deflection circuit according to the present invention.

FIG. 5 is a circuit diagram showing a structure of a third aspect of the first embodiment of the horizontal deflection circuit according to the present invention. In FIG. 5, the reference numeral 38 designates a transformer. A point of difference of the present aspect from the first aspect of FIG. 1 and the second aspect of 2 FIG. 3 is that only one pair of horizontal drive transistor and a horizontal output transistor are provided.

Figure 6:
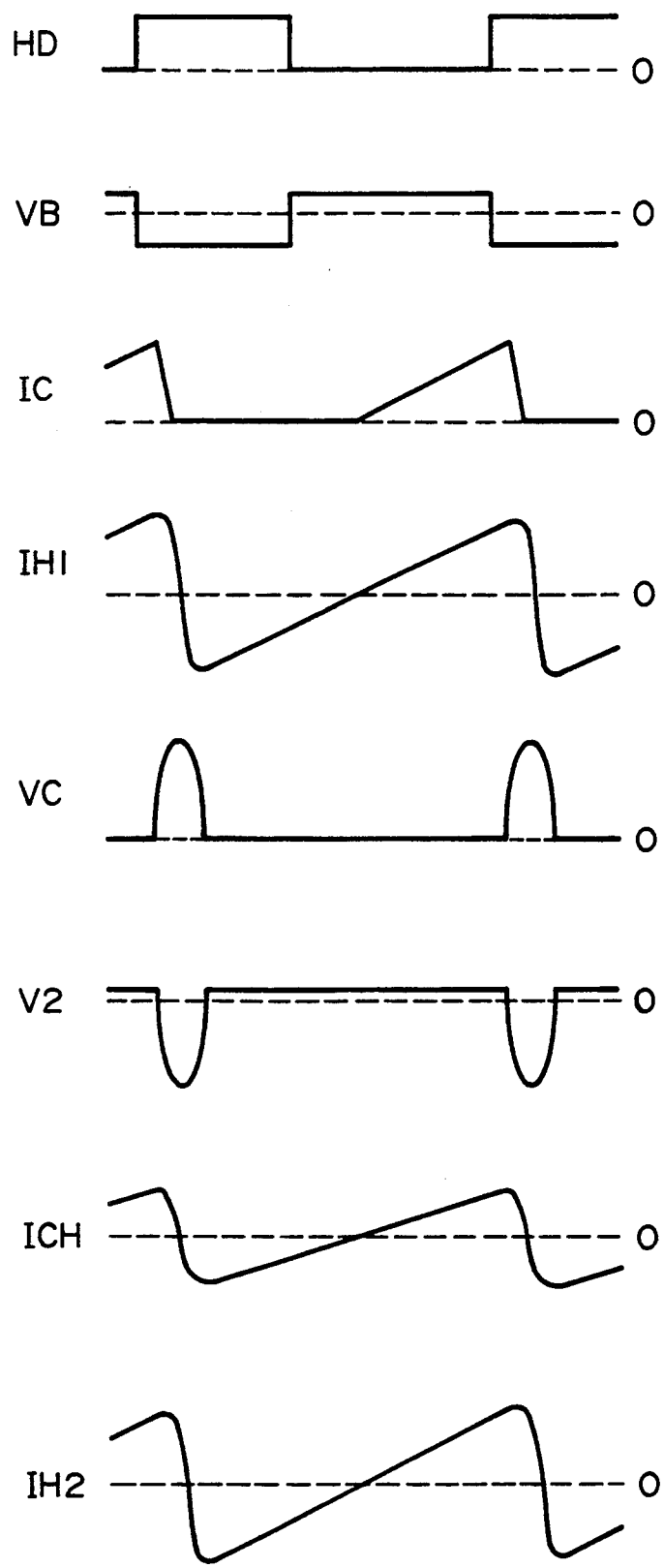
FIG. 6 shows operating waveforms of respective parts of the horizontal deflection circuit shown in FIG. 5.

The operation of the circuit of FIG. 5 will hereinbelow be described with reference to the waveform charts of FIG. 6. FIG. 6 illustrater waveform charts showing the operation of the parts of the horizontal deflection circuit shown in FIG. 5. In the figure, when the horizontal drive signal HD is applied to the input terminal 3, the horizontal drive .transistor 9 is turned on or off, the pulse voltage is induced across the secondary coil of the horizontal drive transformer 5, and the voltage VB, which has a reverse phase with respect to HD, is applied to the base of the horizontal output transistor 15.

As a result, the collector current IC is caused to flow through the horizontal output transistor 15, and the horizontal deflection current IH1 is caused to flow through the horizontal deflection coil 29. At the same time, the positive flyback pulse voltage VC is generated at the collector of the horizontal output transistor 15. This positive flyback pulse voltage VC is applied to the primary coil of the transformer 38 and then its polarity is inverted so that the negative flyback pulse voltage V2 is induced across the secondary coil of the transformer 38. Moreover, the horizontal deflection current IH2 is caused to flow through the second horizontal deflection coil 30.

As a result, since the positive flyback pulse voltage VC and the negative flyback pulse voltage V2 are simultaneously applied to the horizontal deflection yoke 31, the respective electric fields cancel each other. Therefore, it is possible to realize a horizontal deflection circuit with decreased unwanted radiation.

Figure 7:
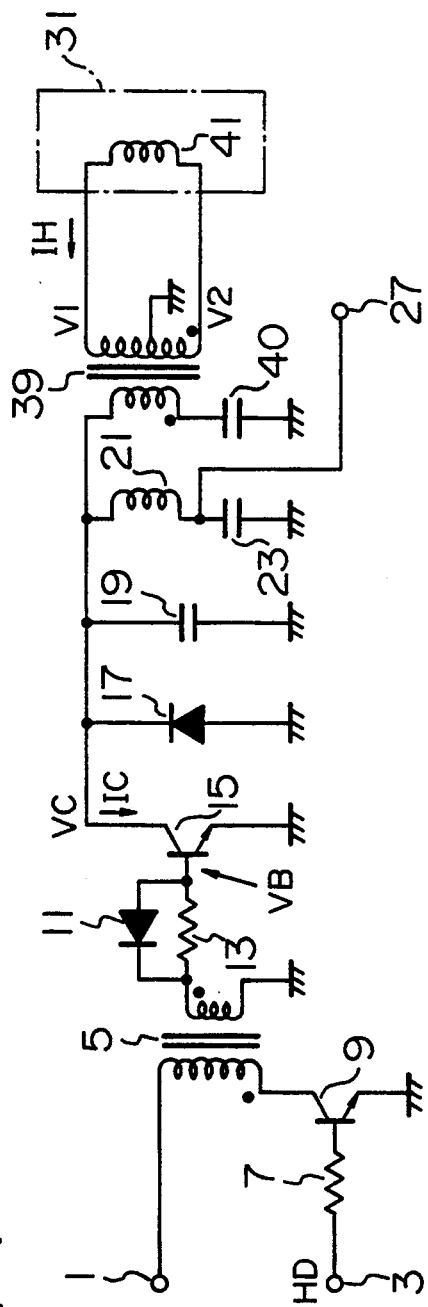
FIG. 7 is a circuit diagram showing a structure of a first aspect of a second embodiment of the horizontal deflection circuit according to the present invention.

FIG. 7 is a circuit diagram showing a structure of a first aspect of a second embodiment of the horizontal deflection circuit according to the present invention. In FIG. 7, the reference numeral 39 designates a transformer in which an intermediate tap of a secondary coil is grounded, the reference numeral 40 designates a capacitor, and the reference numeral 41 designates a horizontal deflection coil. A point of difference of the present aspect of the second embodiment from the above-mentioned aspects of the first embodiment of FIGS. 1 to 6 is that only one horizontal deflection coil of the horizontal deflection yoke is provided.

In the present aspect, both the positive flyback pulse voltage and the negative flyback pulse voltage are induced across the secondary coil of the horizontal output transformer 39, an intermediate tap of which is grounded. Therefore, if one end of the horizontal deflection coil 41 is energized by the positive flyback pulse voltage and the other end of the horizontal deflection coil 41 is energized by the negative flyback pulse voltage, both the positive flyback pulse voltage and the negative flyback pulse voltage are simultaneously applied to the horizontal deflection yoke 31 around which the horizontal deflection coil 41 is wound. As a result, the radiation of an electric field generated by the positive flyback pulse voltage and the radiation of an electric field generated by the negative flyback pulse voltage cancel each other.

Figure 8:
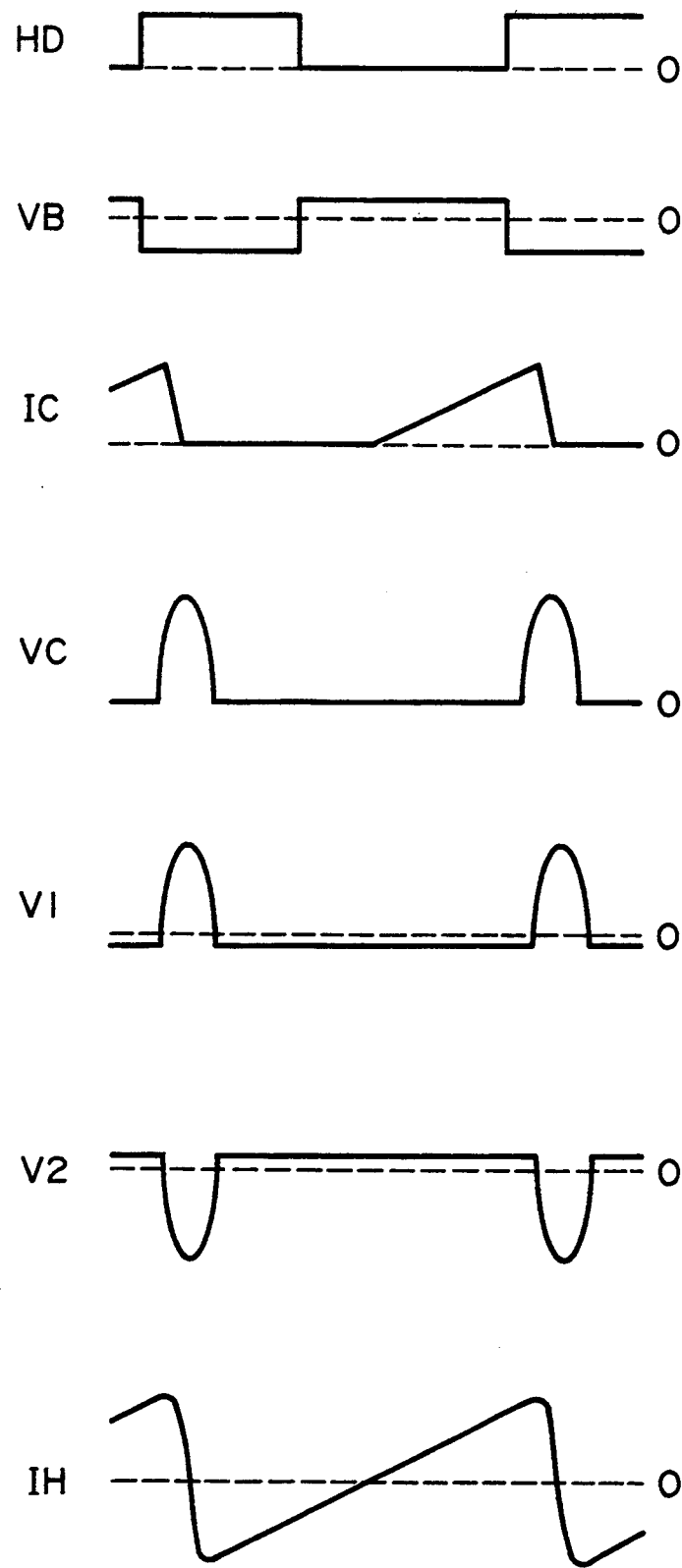
FIG. 8 shows operating waveforms of respective parts of the circuit shown in FIG. 7.

The operation of the circuit of FIG. 7 will hereinbelow be described with reference to the waveform charts shown in FIG. 8. FIG. 8 shows waveform charts of the operation of the parts of the horizontal deflection circuit shown in FIG. 7. In the circuit shown in FIG. 7, when the horizontal drive signal HD is applied to the input terminal 3, the horizontal drive transistor 9 is turned on or off, a pulse voltage is induced across the secondary coil of the horizontal drive transformer 5, and the voltage VB which has a reverse phase with respect to HD is applied to the base of the horizontal output transistor 15.

As a result, the collector current IC is caused to flow through the horizontal output transistor 15. At the same time, the positive flyback pulse voltage VC is generated at the collector of the horizontal output transistor 15. This positive flyback pulse voltage VC is applied to the primary coil of the transformer 39. Since the intermediate point of the secondary coil of the transformer 39 is grounded, the positive flyback pulse voltage V1 is generated at one end of the secondary coil and the negative flyback pulse voltage V2 is generated at the other end of the secondary coil. Moreover, the horizontal deflection current IH is caused to flow through the horizontal deflection coil 41.

As a result, since the positive flyback pulse voltage V1 and the negative flyback pulse voltage V2 are simultaneously applied to the horizontal deflection yoke 31, the radiation of an electric field generated by the positive flyback pulse voltage and the radiation of an electric field generated by the negative flyback pulse voltage cancel each other. Therefore, it is possible to realize a horizontal deflection circuit with decreased unwanted radiation.

Figure 9:
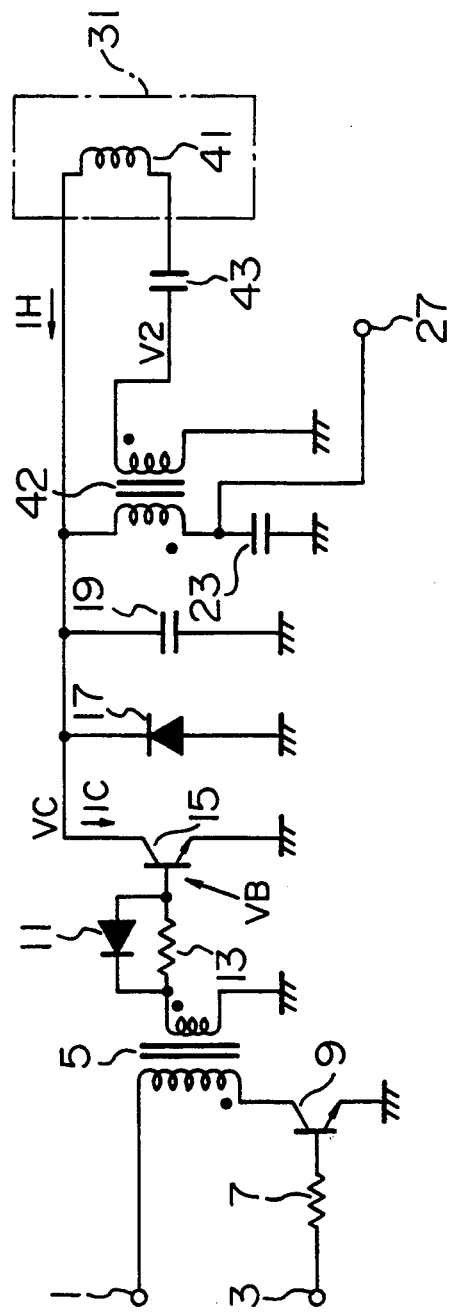
FIG. 9 is a circuit diagram showing a structure of a second aspect of the second embodiment of the horizontal deflection circuit according to the present invention.

FIG. 9 is a circuit diagram showing a structure of a second aspect of the second embodiment of the horizontal deflection circuit according to the present invention. In FIG. 9, the reference numeral 42 designates a transformer, and the reference numeral 43 designates a capacitor.

The circuit of FIG. 9 as the second aspect of the second embodiment performs the same operation as that of the circuit as the first aspect of the second embodiment of FIG. 7. That is, on the basis of the operation of the transformer 42, the horizontal deflection coil 41 is energized by both the positive flyback pulse voltage and the negative flyback pulse voltage. At the same time, the horizontal deflection current IH is caused to flow through the horizontal deflection coil 41.

As a result, since the positive flyback pulse voltage V1 and the negative flyback pulse voltage V2 are simultaneously applied to the horizontal deflection yoke 31, the radiation of the electric fields generated by the respective flyback pulse voltages is cancelled. Therefore, it is possible to realize a horizontal deflection circuit with decreased unwanted radiation.

Figure 10:
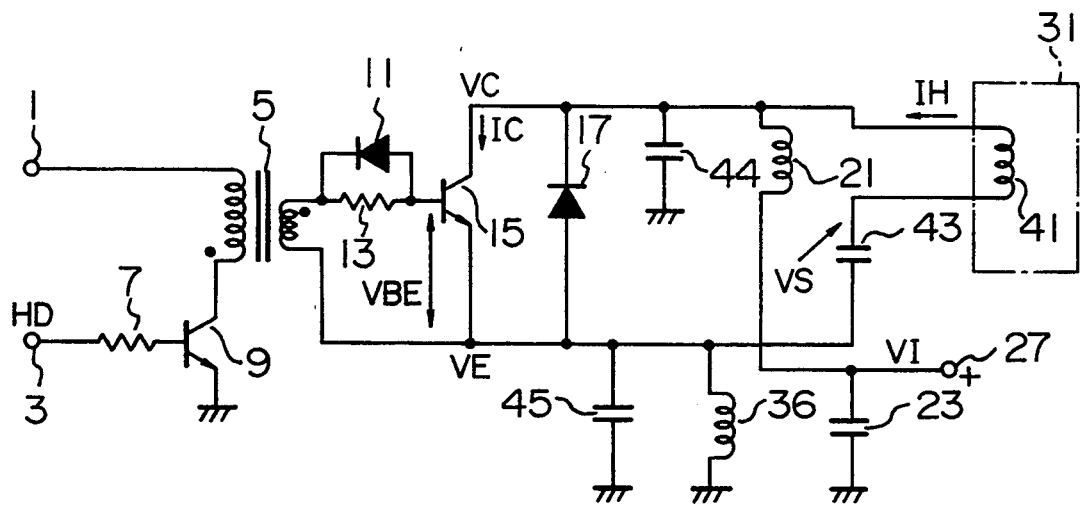
FIG. 10 is a circuit diagram showing a structure of a third aspect of the second embodiment of the horizontal deflection circuit according to the present invention.

FIG. 10 is a circuit diagram showing a structure of a third aspect of the second embodiment of the horizontal deflection circuit according to the present invention. In FIG. 10, the reference numerals 44 and 45 designate resonant capacitors. FIGS. 11A and 11B are waveform charts showing the waveforms of the signals at the respective points shown in the horizontal deflection circuit of FIG. 10.

When the horizontal drive signal HD is applied to the input terminal 3, the horizontal drive transistor 9 is turned on or off, the pulse voltage is induced across the secondary coil of the horizontal drive transformer 5, and the voltage VBE which is 180 degrees out of phase with HD is applied across the base and emitter of the horizontal output transistor 15.

As a result, the collector current IC is caused to flow through the horizontal output transistor 15, and the horizontal deflection current IH is caused to flow through the horizontal deflection coil 41. At the same time, the positive flyback pulse voltage VC is generated at the collector of the horizontal output transistor 15, and the negative flyback pulse voltage VE is generated at the emitter thereof. Moreover, The voltage at the connection between the horizontal deflection coil 41 and the capacitor 43 becomes the negative flyback pulse voltage VS, the average of which is equal to VI.

As a result, since the positive flyback pulse voltage VC and the negative flyback pulse voltage VS are simultaneously applied to the horizontal deflection yoke 31, the radiation of the electric fields generated by the respective flyback pulse voltages is cancelled. Therefore, it is possible to realize a horizontal deflection circuit with decreased unwanted radiation.

Figure 12:
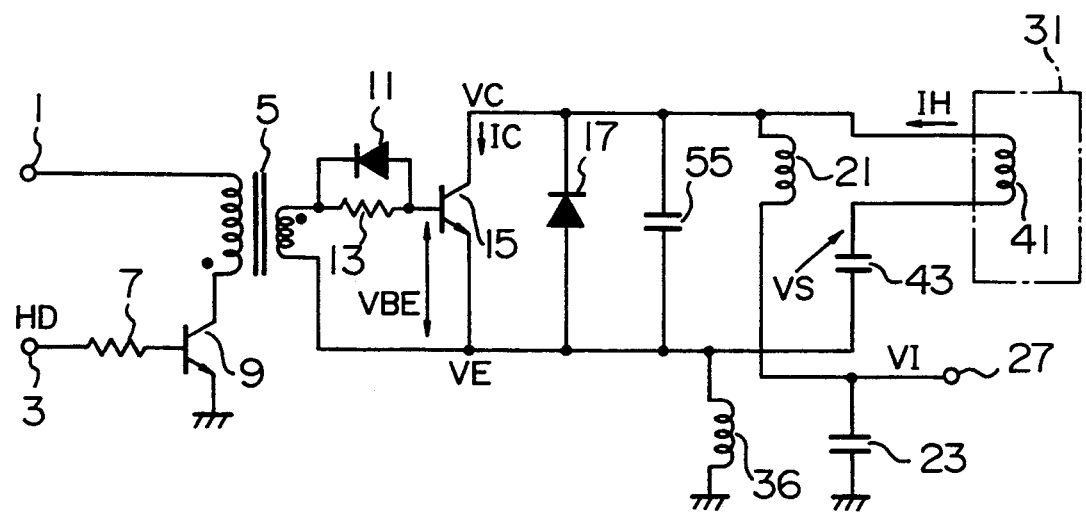
FIG. 12 is a circuit diagram showing a structure of a fourth aspect of the second embodiment of the horizontal deflection circuit according to the present invention.

FIG. 12 is a circuit diagram showing a structure of a fourth aspect of the second embodiment of the horizontal deflection circuit according to the present invention. The fourth aspect is designed in such a way that the two resonant capacitors 44 and 45 in the third aspect are replaced with one resonant capacitor 55 to simplify the circuit structure, but its structure is essentially the same as in the third aspect. Therefore, the description using FIG. 11 with respect to the third aspect may be referred to for the details.

Figure 13:
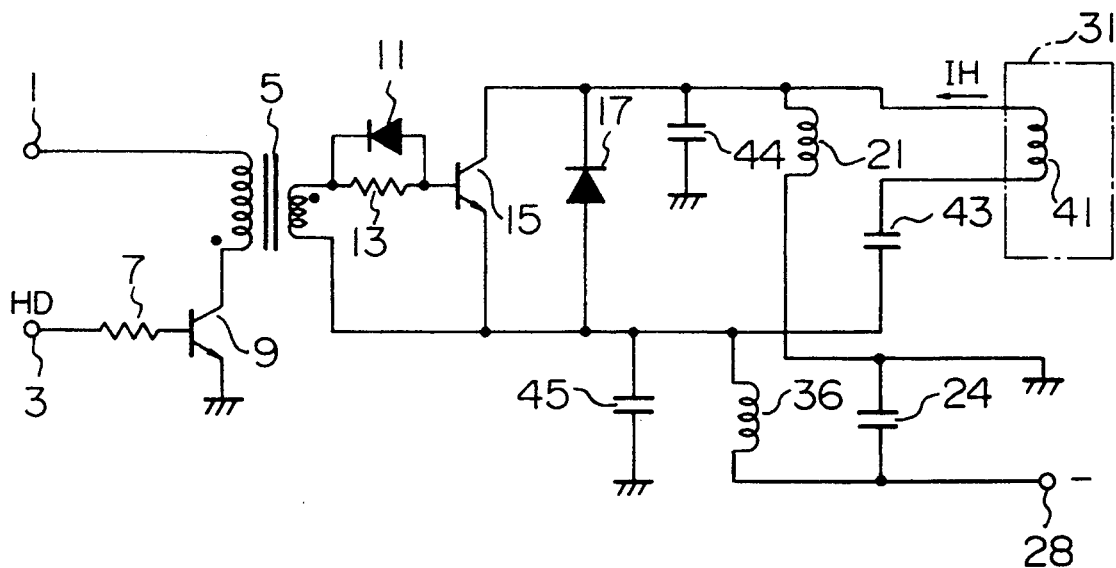
FIG. 13 is a circuit diagram showing a structure of a fifth aspect of the second embodiment of the horizontal deflection circuit according to the present invention.

FIG. 13 is a fifth aspect of the present embodiment. In the fifth aspect, the positive power source system of the third aspect shown in FIG. 10 is only changed to the negative power source system. In the horizontal deflection circuit of the fifth aspect, the choke coil 21 which was connected to the positive power source is grounded, and the choke coil 36 which was grounded is connected to the negative power source through the power source terminal 28.

The horizontal deflection circuit of the present aspect performs the same operation as that of the circuit of the third aspect shown in FIG. 10. As a result, the horizontal deflection coil 41 is energized by both the positive flyback pulse voltage and the negative flyback pulse voltage. At the same time, the horizontal deflection current IH is caused to flow through the horizontal deflection coil 41.

As a result, since the positive flyback pulse voltage and the negative flyback voltage are simultaneously applied to the horizontal deflection yoke 31, the radiation of the electric fields generated by the respective flyback pulse voltages is cancelled. Therefore, it is possible to realize a horizontal deflection circuit with decreased unwanted radiation.

Figure 14:
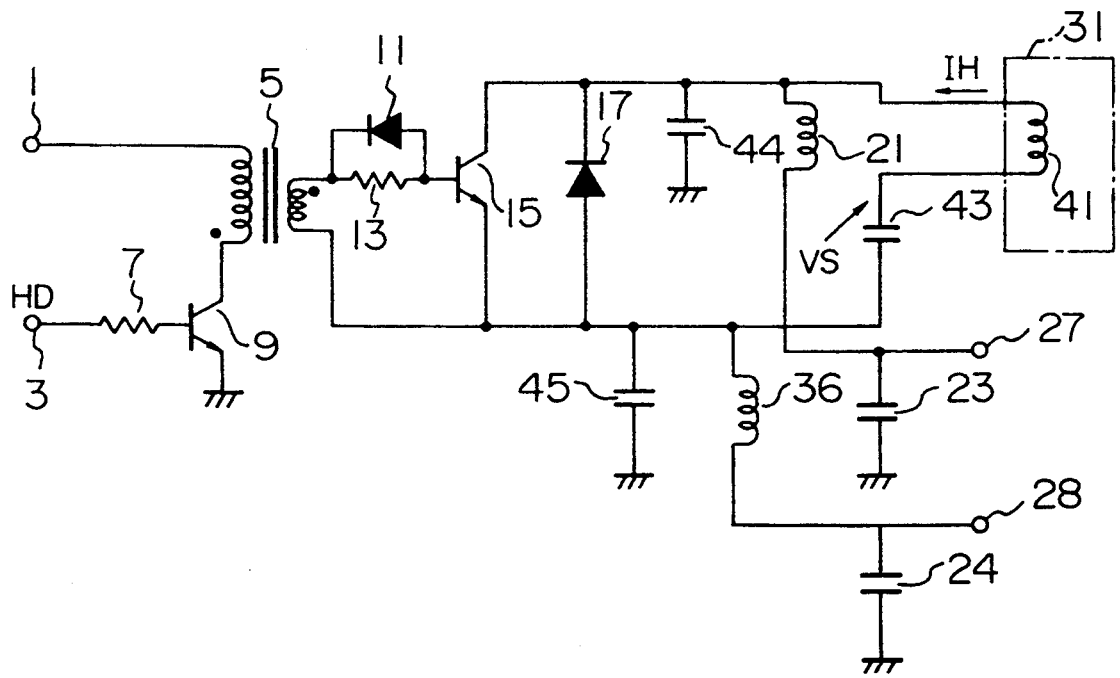
FIG. 14 is a circuit diagram showing a structure of a sixth aspect of the second embodiment of the horizontal deflection circuit according to the present invention.

FIG. 14 is a circuit diagram showing a structure of a sixth aspect of the present invention. The horizontal deflection circuit of the sixth aspect is designed in such a way that the power source input method is only changed to the positive and negative power source input method. Therefore, the circuit of the present aspect performs the same operation as that of the circuit of the third aspect of FIG. 10 or the circuit of the fifth aspect of FIG. 13. As a result, the horizontal deflection coil 41 is energized by both the positive flyback pulse voltage and the negative flyback pulse voltage. At the same time, the horizontal deflection current IH is caused to flow through the horizontal deflection coil 41.

As a result, since the positive flyback pulse voltage and the negative flyback pulse voltage are simultaneously applied to the horizontal deflection yoke 31, the radiation of the electric fields generated by the respective flyback pulse voltages is cancelled. Therefore, it is possible to realize a horizontal deflection circuit with decreased unwanted radiation.

Figure 15:
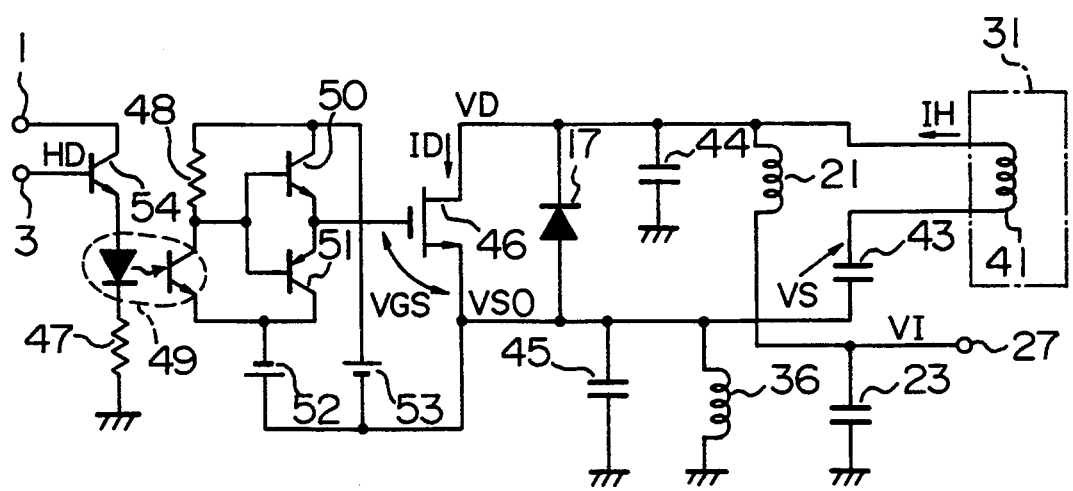
FIG. 15 is a circuit diagram showing a structure of a seventh aspect of the second embodiment of the horizontal deflection circuit according to the present invention.

FIG. 15 is a circuit diagram showing a structure of a seventh aspect of the present embodiment. In FIG. 15, the reference numeral 46 designates a horizontal output transistor, the reference numerals 47 and 48 designate resistors, the reference numeral 49 designates a photo coupler, the reference numerals 50 and 51 designate transistors, the reference numerals 52 and 53 designate floating power sources, and the reference numeral 54 designates a transistor.

The seventh aspect employs a power MOS FET as the horizontal output transistor, and performs the same operation as that of the circuit of the third aspect shown in FIG. 10.

That is, when the horizontal drive signal HD is applied to the input terminal 3, the transistor 54 is turned on or off, and on the basis of the action of the photo coupler 48, the transistor 50, and the transistor 51, the voltage VGS which has a reverse phase with respect to the horizontal drive signal HD is applied across the gate and source of the horizontal output transistor 46.

As a result, a drain current ID is caused to flow through the horizontal output transistor 46, and the horizontal deflection current IH is caused to flow through the horizontal deflection coil 41. At the same time, the positive flyback pulse voltage VD is generated at the drain of the horizontal output transistor 46, and the negative flyback pulse voltage VS0 is generated at the source of the horizontal output transistor 46. Moreover, the voltage at the connection between the horizontal deflection coil 41 and the capacitor 43 becomes the negative flyback pulse voltage VS the average of which is equal to VI.

As a result, since the positive flyback voltage VD and the negative flyback pulse voltage VS are simultaneously applied to the horizontal deflection yoke 31, the radiation of the electric fields generated by the respective flyback pulse voltages is cancelled. Therefore, it is possible to realize a horizontal deflection circuit with decreased unwanted radiation.

Incidentally, two resonant capacitors (44, 45) are provided in FIGS. 13, 14 and 15. However, alternatively, even if one resonant capacitor is connected in parallel between the ends of the damper diode 17, the same circuit operation and effects as those in the above-mentioned cases can be obtained.

As set forth hereinabove, according to the horizontal deflection circuit of the present invention, the radiation of the unwanted electric field or fields from the horizontal deflection circuit can be remarkably decreased with the simple circuit structure.

Figure 16:
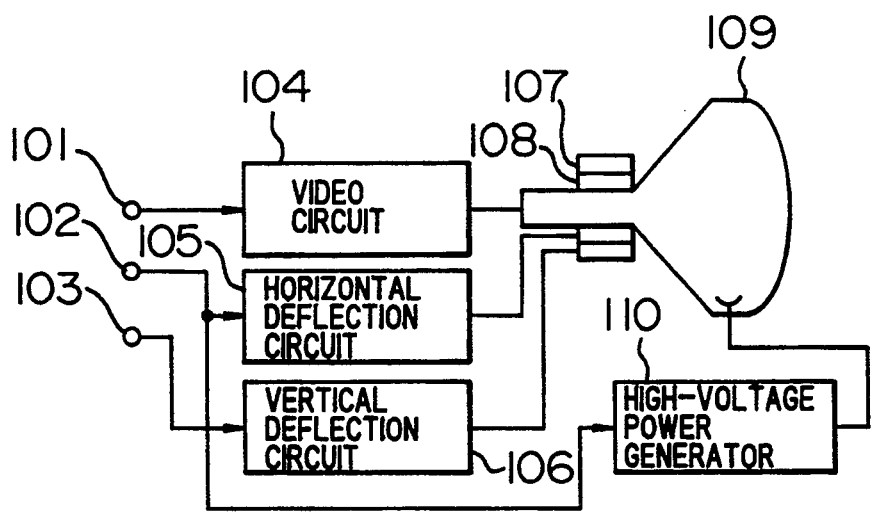
FIG. 16 is a block diagram showing a structure of a CRT display relating to the present invention.

FIG. 16 shows a CRT display which is designed in such a way that the horizontal deflection circuit of the present invention is incorporated therein to drive a horizontal deflection coil of a yoke. In the figure, the reference numeral 101 designates a first input terminal, the reference numeral 102 designates a second input terminal, the reference numeral 103 designates a third input terminal, the reference numeral 104 designates a video circuit, the reference numeral 105 designates a horizontal deflection circuit including the above-mentioned circuit, the reference numeral 106 designates a vertical deflection circuit, the reference numeral 107 designates a vertical deflection coil, the reference numeral 108 designates a horizontal deflection coil, the reference numeral 109 designates CRT, and the reference numeral 110 designates a high-voltage power generator. A video signal is input to the video circuit 104 through the first input terminal 101. The video circuit emits an electron beam corresponding to the video signal from an electron gun provided in CRT. A vertical synchronous signal is input through the third input terminal 103 to be processed in the vertical deflection circuit 106 to generate a vertical sweep magnetic field in the vertical deflection coil 108, thereby to deflect vertically the electron beam. Moreover, a horizontal synchronous signal is input through the second terminal 102 to be processed in the horizontal deflection circuit 105 to generate a horizontal sweep magnetic field in the horizontal deflection coil 108, thereby to deflect horizontally the electron beam. At this time, the flyback pulse voltage is induced across the coil. However, this flyback pulse voltage includes both a positive component and a negative component on the basis of the action of the horizontal deflection circuit. Then, the radiation of an electric field generated by the positive flyback voltage component and the radiation of an electric field generated by the negative flyback voltage component cancel each other in the position of an operator who is performing the necessary operation while facing the CRT. As a result, the amplitude of the composite component becomes very small. Incidentally, the high-voltage power generator 110 including a flyback transformer and the like produces D.C. voltage of about 25 kV using the horizontal synchronous signal to apply the resultant D.C. voltage to an anode in the CRT. In the CRT display of the present invention as constructed in the above manner, the positive electric field of VLF and the negative electric field of VLF, which are generated in the horizontal deflection coil of the yoke due to the respective flyback pulse voltage components, cancel each other so that the composite electric field of VLF emitted from the yoke is reduced. Therefore, the amplitude of the electric field of VLF which leaks to the front surface of the screen is small. Accordingly, even if there is the possibility that the electric field of VLF may affect the health of an operator, according to the CRT display of the present invention, the risk of doing such harm to the health of an operator is very small.

Figure 17:
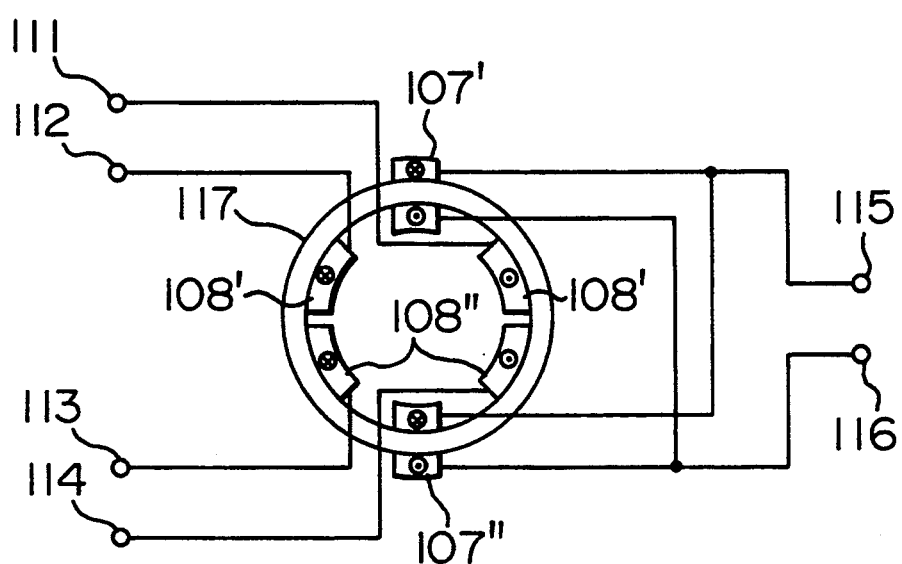
FIG. 17 is a view showing a structure of a horizontal deflection yoke relating to the present invention.

FIG. 17 shows a deflection yoke for CRT which includes two horizontal deflection coils each having associated electric input terminals. In the figure, the reference numeral 117 designates a core, the reference numerals 107' and 107" designate vertical deflection coils which are wound around the core 117 and which have input terminals 115 and 116, respectively. Moreover, the reference numeral 108' designates a first horizontal deflection coil which is wound around the core 117 and which has input terminals 111 and 112, and the reference numeral 108" designates a second horizontal deflection coil which is wound around the core 117 and which has input terminals 113 and 114. The pair of electric input terminals of the first horizontal deflection coil and the pair of electric input terminals of the second horizontal deflection coil are provided independently of each other. Therefore, in the case where the horizontal deflection circuit of the first embodiment is applied, the pairs of electric input terminals are connected to the first horizontal output circuit and the second horizontal output circuit independently of each other to enable the above function to be displayed. Moreover, if the pairs of input terminals of both the coils are connected in parallel with each other, the first and second horizontal deflection coils become equal to one horizontal deflection coil which is applicable to the horizontal deflection circuit of the second embodiment of the present invention. Also, it can be used for the prior art horizontal deflection circuit.

We claim:

1. A horizontal deflection circuit for generating a horizontal scanning magnetic field in a horizontal deflection yoke by being driven by a sawtooth waveform current to deflect an electron beam horizontally, said circuit including:
   a horizontal drive circuit part for receiving an oscillation signal having an oscillation frequency and for amplifying said oscillation signal to supply an output signal;
   a horizontal output circuit part for generating said sawtooth waveform current in accordance with said output signal; and
   first and second horizontal deflection coils wound around said horizontal deflection yoke, said coils being independent of one another and being energized by said sawtooth waveform current to generate said magnetic field in said horizontal deflection yoke,
   wherein said horizontal output circuit part includes a first output circuit for causing said sawtooth waveform current to flow through said first horizontal deflection coil to generate a first part of said magnetic field in said horizontal deflection yoke in one direction and to induce a first flyback voltage therein, and a second output circuits operating independently of the first output circuit, for causing said sawtooth waveform current to flow through said second horizontal deflection coil to generate a second part of said magnetic field in said horizontal deflection yoke in the same direction as that of said first part of said magnetic field and to induce a second flyback voltage opposite in polarity to said first flyback voltage therein, so that radiation of an electric field generated by said first flyback voltage is decreased by radiation of an electric field generated by said second flyback voltage.

2. A circuit according to claim 1, wherein said second output circuit includes a transformer for receiving said first flyback voltage in said first output circuit, reversing polarity of said first flyback voltage, and outputting the resultant flyback voltage.

3. A horizontal deflection circuit for generating a horizontal scanning magnetic field in a horizontal deflection yoke by being driven by a sawtooth waveform current to deflect an electron beam horizontally, said circuit including:
- a horizontal drive circuit part for receiving an oscillation signal having an oscillation frequency and for amplifying said oscillation signal to supply an output signal;
- a horizontal output circuit part for generating said sawtooth waveform current in accordance with said output signal; and
- a horizontal deflection coil wound around said horizontal deflection yoke, said coil being energized by said sawtooth waveform current to generate said magnetic field in said horizontal deflection yoke,
- wherein when said sawtooth waveform current is caused to flow through said horizontal deflection coil, said horizontal output circuit part applies a positive flyback voltage compared to a ground potential generated in said horizontal deflection coil at one end of said horizontal defection coil and applies a negative flyback voltage compared to said ground potential at another end of the horizontal deflection coil, so that the composite component of the radiation of an electric field generated by said positive flyback voltage and the radiation of an electric field generated by said negative flyback voltage is decreased, wherein said horizontal output circuit part includes a final output stage with a transformer including a secondary coil having a first end, a second end and an intermediate point, said intermediate point being grounded, and
- wherein said first end of said secondary coil is connected to a first end of said horizontal deflection coil and the second end of said secondary coil is connected to a second end of said horizontal deflection coil, so that a positive flyback voltage induced between said intermediate point and said first end of said secondary coil is applied to said first end of said horizontal deflection coil, and a negative flyback voltage induced between said intermediate point and said second end of said secondary coil is applied to a second end of said horizontal deflection coil.

4. A horizontal deflection circuit for generating a horizontal scanning magnetic field in a horizontal deflection yoke by being driven by a sawtooth waveform current to deflect an electron beam horizontally, said circuit including:
- a horizontal drive circuit part for receiving an oscillation signal having an oscillation frequency and for amplifying said oscillation signal to supply an output signal;
- a horizontal output circuit part for generating said sawtooth waveform current in accordance with said output signal; and
- a horizontal deflection coil wound around said horizontal deflection yoke, said coil being energized by said sawtooth waveform current to generate said magnetic field in said horizontal deflection yoke,
- wherein when said sawtooth waveform current is caused to flow through said horizontal deflection coil, said horizontal output circuit part applies a positive flyback voltage compared to a ground potential generated in said horizontal deflection coil at one end of said horizontal defection coil and applies a negative flyback voltage compared to said ground potential at another end of the horizontal deflection coil, so that the combination of the radiation of an electric field generated by said positive flyback voltage and the radiation of an electric field generated by said negative flyback voltage is decreased, wherein said horizontal output circuit part includes a coil having a primary winding and a secondary winding, said output signal is coupled to said primary winding to generate an electromotive force opposite in polarity to said output signal from said secondary winding, and said output signal and electromotive force are applied in series to said horizontal deflection coil.

5. A circuit according claim 4, wherein said coil is a flyback transformer.

6. A horizontal deflection circuit for generating a horizontal scanning magnetic field in a horizontal deflection yoke by being driven by a sawtooth waveform current to deflect an electron beam horizontally, said circuit including:
- a horizontal drive circuit part for receiving an oscillation signal having an oscillation frequency and for amplifying said oscillation signal to supply an output signal;
- a horizontal output circuit part for generating said sawtooth waveform current in accordance with said output signal; and
- a horizontal deflection coil wound around said horizontal deflection yoke, said coil being energized by said sawtooth waveform current to generate said magnetic field in said horizontal deflection yoke,
- wherein when said sawtooth waveform current is caused to flow through said horizontal deflection coil, said horizontal output circuit part applies a positive flyback voltage compared to a ground potential generated in said horizontal deflection coil at one end of said horizontal defection coil and applies a negative flyback voltage compared to said ground potential at another end of the horizontal deflection coil, so that the combination of the radiation of an electric field generated by said positive flyback voltage and the radiation of an electric field generated by said negative flyback voltage is decreased, wherein said horizontal output circuit part includes:
- a first bus;
- a second bus;
- a parallel circuit in which a horizontal output transistor driven by said output signal from said horizontal drive circuit part, a damper diode, and a series circuit comprised of a horizontal deflection coil and a capacitor are connected in parallel between said first bus and said second bus;
- a first resonant capacitor having one end connected to said first bus and the other end connected to ground potential;
- a second resonant capacitor having one end connected to said second bus and the other end connected to ground potential;
- a first choke coil having one end connected to said first bus and the other end connected to a power source; and
- a second choke coil having one end connected to said second bus and the other end connected to ground potential.

7. A horizontal deflection circuit for generating a horizontal scanning magnetic field in a horizontal deflection yoke by being driven by a sawtooth waveform current to deflect an electron beam horizontally, said circuit including:
- a horizontal drive circuit part for receiving an oscillation signal having an oscillation frequency and for amplifying said oscillation signal to supply an output signal;
- a horizontal output circuit part for generating said sawtooth waveform current in accordance with said output signal; and
- a horizontal deflection coil wound around said horizontal deflection yoke, said coil being energized by said sawtooth waveform current to generate said magnetic field in said horizontal deflection yoke,
- wherein when said sawtooth waveform current is caused to flow through said horizontal deflection coil, said horizontal output circuit part applies a positive flyback voltage compared to a ground potential generated in said horizontal deflection coil at one end of said horizontal defection coil and applies a negative flyback voltage compared to said ground potential at another end of the horizontal deflection coil, so that the combination of the radiation of an electric field generated by said positive flyback voltage and the radiation of an electric field generated by said negative flyback voltage is decreased, wherein said horizontal output part includes:
- a first bus;
- a second bus;
- a parallel circuit in which a horizontal output transistor driven by said output signal from said horizontal drive circuit part, a damper diode, and a series circuit comprised of a horizontal deflection coil and a capacitor are connected in parallel between said first bus and said second bus;
- a first resonant capacitor having one end connected to said first bus and the other end connected to ground potential;
- a second resonant capacitor having one end connected to said second bus and the other end connected to ground potential;
- a first choke coil having one end connected to said first bus and the other end connected to a positive power source; and
- a second choke coil having one end connected to said second bus and the other end connected to a negative power source.

* * * * *